United States Patent [19]

Wakai et al.

[11] 3,714,598

[45] Jan. 30, 1973

[54] AUTOMATIC GAIN CONTROL AMPLIFIER

[75] Inventors: Shuzo Wakai, Kyoto; Mitsuo Nabae, Takatsuki, both of Japan

[73] Assignee: Matsushita Electronics Corporation, Osaka, Japan

[22] Filed: March 22, 1971

[21] Appl. No.: 126,457

[30] Foreign Application Priority Data

March 27, 1970 Japan ................................45/26352

[52] U.S. Cl. ....................330/29, 325/319, 325/478, 330/145

[51] Int. Cl. ..............................................H03g 3/30

[58] Field of Search ........325/319, 478, 413; 330/29, 330/145; 178/DIG. 12

[56] References Cited

UNITED STATES PATENTS

| | | | |
|---|---|---|---|
| 3,596,184 | 7/1971 | Hanus et al. | 325/478 |
| 3,213,372 | 10/1965 | Kurvits | 325/478 |

*Primary Examiner*—Roy Lake
*Assistant Examiner*—James B. Mullins
*Attorney*—Stevens, Davis, Miller & Mosher

[57] ABSTRACT

An AGC amplifier having a Darlington pair as a noise gate circuit for preventing the development of unwanted AGC outputs due to noise pulses. The Darlington pair develops a larger overdrive with the same base current than if a single transistor is employed, so a longer storage time of the transistors results, lengthening the gate period. This makes available an AGC amplifier circuit with a noise gate circuit whose gate period is longer without using a capacitor, thereby providing a convenient means for application to monolithic integrated circuits.

4 Claims, 2 Drawing Figures

S. WAKAI
AND
M. NABAE
INVENTORS

BY Stevens, Davis, Miller & Mosher
ATTORNEYS

AUTOMATIC GAIN CONTROL AMPLIFIER

The present invention relates to an automatic gain control amplifier, or more particularly, to an automatic gain control amplifier having a noise gate circuit suitable for application to semiconductor integrated circuits.

An AGC amplifier circuit functions to automatically control the gain in order to obtain an almost constant output notwithstanding variations in input signals. Such an AGC circuit tends to produce an unwanted AGC output due to noise pulses, and there is, for example, a gated AGC amplifier circuit (keyed AGC amplifier circuit) for avoiding the influence of the noise pulses.

Figure 1:
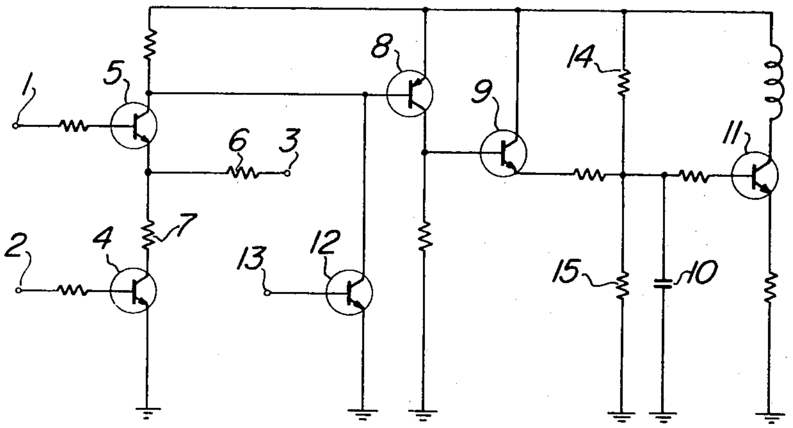
FIG. 1 PRIOR ART
Figure 2:
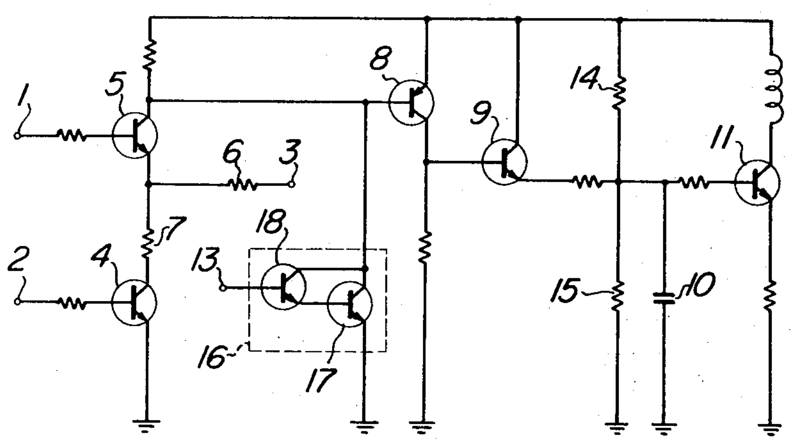

Objects, features and advantages of the present invention will become apparent from the following detailed description of the preferred embodiments taken in conjunction with the accompanying drawings, in which:

FIG. 1 is a diagram showing a conventional AGC amplifier circuit with a noise gate circuit; and FIG. 2 shows a diagram of an AGC amplifier circuit embodying the present invention.

An example of the gated AGC circuit is shown in FIG. 1 in which video signals are applied to a terminal 1 and fly-back pulses are applied to a terminal 2, while a threshold voltage which determines the signal level for the operation of the AGC amplifier circuit is applied to a terminal 3.

In this conventional AGC circuit, a transistor 4 conducts during the fly-back period, and therefore a division of the voltage applied to the terminal 3 by the resistors 6 and 7 is applied to the emitter of the transistor 5.

Therefore, the transistor 5 is rendered conductive when a video signal higher than a threshold voltage, i.e., the sum of the base-emitter voltage ($V_{BE}$) and the division voltage, is fed to the terminal 1.

Conduction of transistor 5 is followed by the conduction of transistors 8 and 9, so that the capacitor 10 is charged and the voltage thereacross increased, resulting in an increase in the emitter current of a transistor 11. In a case where the transistor 11 constitutes a video intermediate frequency amplifier of a television receiver of what is called the forward AGC type in which the gain is decreased with an increase in emitter current, the application of a large video signal to the terminal 1 causes the voltage across the capacitor 10 to increase due to the above-described circuit operation and the emitter current in the transistor 11 is increased to thereby reduce the gain of the same. A smaller video signal is applied to the terminal 1 and the voltage across the capacitor 10 is reduced, with the result that automatic gain control of the transistor 11 is achieved in such a manner as to produce a constant video signal output determined by the threshold voltage.

However, once large noise pulses in the same direction as the synchronizing pulses appear in the video signal, the capacitor 10 is overcharged and the transistor 11 is energized with an extremely large emitter current, whereby the video signal is temporarily extinguished thereby spoiling the image. This condition continues until the overcharged capacitor 10 is restored to its normal state according to the time constant of the circuit. To cope with this problem, a transistor 12 for a noise gate is inserted between the base of the transistor 8 and the ground. An output of a noise detector circuit (not shown) for detecting noise pulses higher than a certain voltage level is applied to the terminal 13 connected with the base of the transistor 12, and as long as the output is produced from the noise detector circuit, the transistor 12 is kept conducting, so that the base of the transistor 8 is short-circuited to cut off the transistor 8. Thus, overcharging of the capacitor 10 due to the noise pulses is removed, and an abnormal increase in the emitter current of the transistor is suppressed, thereby preventing the video signal from being extinguished.

In such a noise gate circuit, it is most important that the gate period of the noise gate circuit during which the transistor 12 conducts be long enough to fully accommodate the pulse width of a noise pulse reaching the terminal 1. However, a single transistor as shown constituting a noise gate circuit is unable to develop a sufficiently long gate period. This is because the ordinary circuit design is such that the output of the noise detector circuit is smaller in width than a noise pulse.

One conceivable method to overcome this problem resides in connecting a capacitor between the base and emitter or between the collector and base of the transistor 12. This is, however, technologically difficult to realize when applied to monolithic integrated circuits, adding to the problem of high production costs.

Incidentally, numerals 14 and 15 show resistors for supplying base biases to the base of the transistor 11.

The present invention is aimed at obviating the above-described problem of the conventional AGC amplifier circuit and is characterized by a Darlington pair which is inserted in place of the transistor 12 of FIG. 1.

An AGC amplifier embodying the present invention is shown in FIG. 2, from which it is seen that the Darlington pair 16 comprising transistors 17 and 18 is inserted between the base of the transistor 8 for second-stage AGC amplification and ground. This noise gate circuit lengthens the noise gate period. This is because the current amplification of the Darlington pair is the product of the current amplification factors of the transistors 17 and 18 and is much higher than that of the conventional noise gate circuit. The result is a much larger overdrive by the same base current than if a single transistor were employed, causing a longer storage time of the transistors for a longer gate period (conduction period of the transistors). In other words, the transistor 17 of the Darlington pair 16 conducts, and when it is saturated, electric charges are stored in the base of the transistor 17. Therefore, when the voltage at the terminal 13 connected with the base of the transistor 18 and the Darlington pair enters a cut-off state, the transistor 18 is cut-off, but the transistor 17 continues in a conductive state because of the base current which flows until the electric charges are depleted from the base region of transistor 17.

The base-emitter junction of the transistor 18 functions as a diode connected in the reverse direction with respect to the base reverse current and impedes the flow of the base reverse current which might otherwise flow in the form of electric charges released from the base of the transistor 17. As a result, it takes a long time until the electric charges stored in the base region of the transistor 17 are depleted, thereby remarkably increasing the gate period.

As can be seen from the above description, the AGC amplifier circuit according to the present invention is provided with a noise gate circuit whose gate period is long enough to accommodate the width of a noise pulse which arrives mixed with a video signal applied to the base of the transistor for the first-stage AGC amplification. Thus, adverse effects which might otherwise impair the operation of the AGC circuit are completely prevented.

In addition, since the noise gate circuit according to the invention comprises transistors, there is no need to insert a capacitor to lengthen its gate period, thereby providing a very convenient means of application for monolithic integrated circuits.

It is needless to say that instead of the Darlington pair which comprises the transistors 17 and 18, three or more stages may be provided for achieving the same purpose.

In spite of the above description in which reference is made to a gated AGC amplifier circuit, the present invention is also applicable to other AGC amplifier circuits.

What we claim is:

1. An automatic gain control amplifier comprising
   a first transistor having an input voltage applied to its base and a DC bias voltage applied to its emitter, said emitter being coupled to a ground reference point,
   a second transistor having a base connected to the collector of said first transistor,
   a capacitor connected in the collector-emitter circuit of said second transistor, and
   third and fourth transistors connected to form a Darlington pair and having a voltage derived from noise pulses coupled thereto, said Darlington pair being interposed between the base of said second transistor and ground thereby extending the noise cancelling period of said automatic gain control amplifier by utilizing the long storage time of said third and fourth transistors.

2. An automatic gain control circuit as defined by claim 1 which further comprises a fifth transistor having its emitter coupled to said capacitor and its base coupled to the collector of said second transistor.

3. An automatic gain control circuit as defined by claim 2 wherein the emitter of said first transistor is coupled to said ground reference point through the collector-emitter circuit of a sixth transistor.

4. An automatic gain control circuit as defined by claim 1 wherein the collectors of said third and fourth transistors are coupled together and to the base of said second transistor, the emitter of said third transistor to the base of said fourth transistor and the emitter of said fourth transistor to said ground reference point, the voltage derived from noise pulses being coupled to the base of said third transistor.

* * * * *